(12) United States Patent
Hsu et al.

(10) Patent No.: US 9,214,575 B2
(45) Date of Patent: Dec. 15, 2015

(54) SOLAR CELL CONTACT AND METHOD OF MAKING THE CONTACT

(71) Applicant: TSMC SOLAR LTD., Taichung (TW)

(72) Inventors: Wei Chun Hsu, Taipei (TW); Chen Yun Wang, Kaohsiung (TW)

(73) Assignee: TSMC Solar Ltd., Taichung (TW)

( * ) Notice: Subject to any disclaimer, the term of this patent is extended or adjusted under 35 U.S.C. 154(b) by 23 days.

(21) Appl. No.: 14/175,105

(22) Filed: Feb. 7, 2014

(65) Prior Publication Data

US 2015/0228821 A1    Aug. 13, 2015

(51) Int. Cl.
*H01L 31/02*  (2006.01)
*H01L 31/0224*  (2006.01)
*H01L 31/18*  (2006.01)

(52) U.S. Cl.
CPC ........ *H01L 31/022433* (2013.01); *H01L 31/18* (2013.01)

(58) Field of Classification Search
None
See application file for complete search history.

(56) References Cited

PUBLICATIONS

U.S. Appl. No. 13/621,879, filed Sep. 18, 2012.

*Primary Examiner* — Scott B Geyer
(74) *Attorney, Agent, or Firm* — Duane Morris LLP; Steven E. Koffs

(57) ABSTRACT

A solar panel comprises a back contact layer, an absorber layer over the back contact layer, a buffer layer over the absorber layer, and a front contact layer comprising a transparent conductive material over the buffer layer. The front contact layer has a plurality of outer edges and a seed layer comprising a seed layer material along the outer edges.

20 Claims, 16 Drawing Sheets

SOLAR CELL CONTACT AND METHOD OF MAKING THE CONTACT

PRIORITY CLAIM AND CROSS-REFERENCE

None.

BACKGROUND

The present disclosure generally relates to photovoltaic solar cells, and more particularly to thin film solar cells and methods for forming same.

Thin film photovoltaic (PV) solar cells are one class of energy source devices which harness a renewable source of energy in the form of light that is converted into useful electrical energy which can be used for numerous applications. Thin film solar cells are multi-layered semiconductor structures formed by depositing various thin layers and films of semiconductor and other materials on a substrate. These solar cells can be made into light-weight flexible sheets in some forms comprised of a plurality of individual electrically interconnected cells. The attributes of light weight and flexibility gives thin film solar cells broad potential applicability as an electric power source for use in portable electronics, aerospace, and residential and commercial buildings where they can be incorporated into various architectural features such as roof shingles, facades, and skylights.

Thin film solar cell semiconductor packages generally include a bottom contact or electrode formed on the substrate, an absorber, and a top contact or electrode formed above the bottom contact. Front contacts have been made for example of light transparent conductive oxide ("TCO") materials. TCO materials are susceptible to attack and degradation by environment factors including water, oxygen, and carbon dioxide. Such TCO degradation may induce high series resistance (Rs) and result in lower solar energy conversions efficiencies for the solar cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features can be arbitrarily increased or reduced for clarity of discussion.

DETAILED DESCRIPTION

Figure 1:
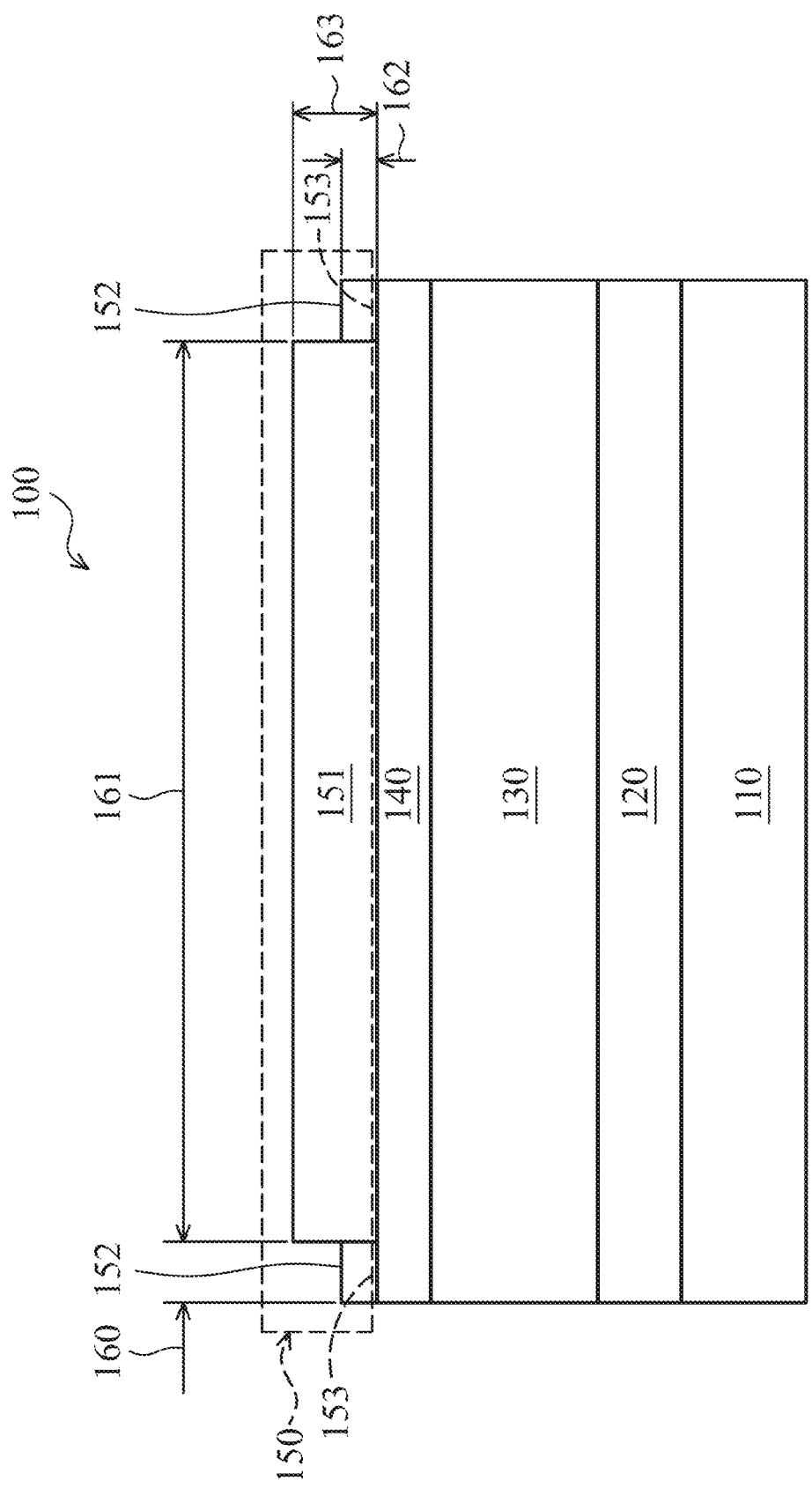
FIG. 1 is a cross-sectional view of a solar panel, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

Figure 2:
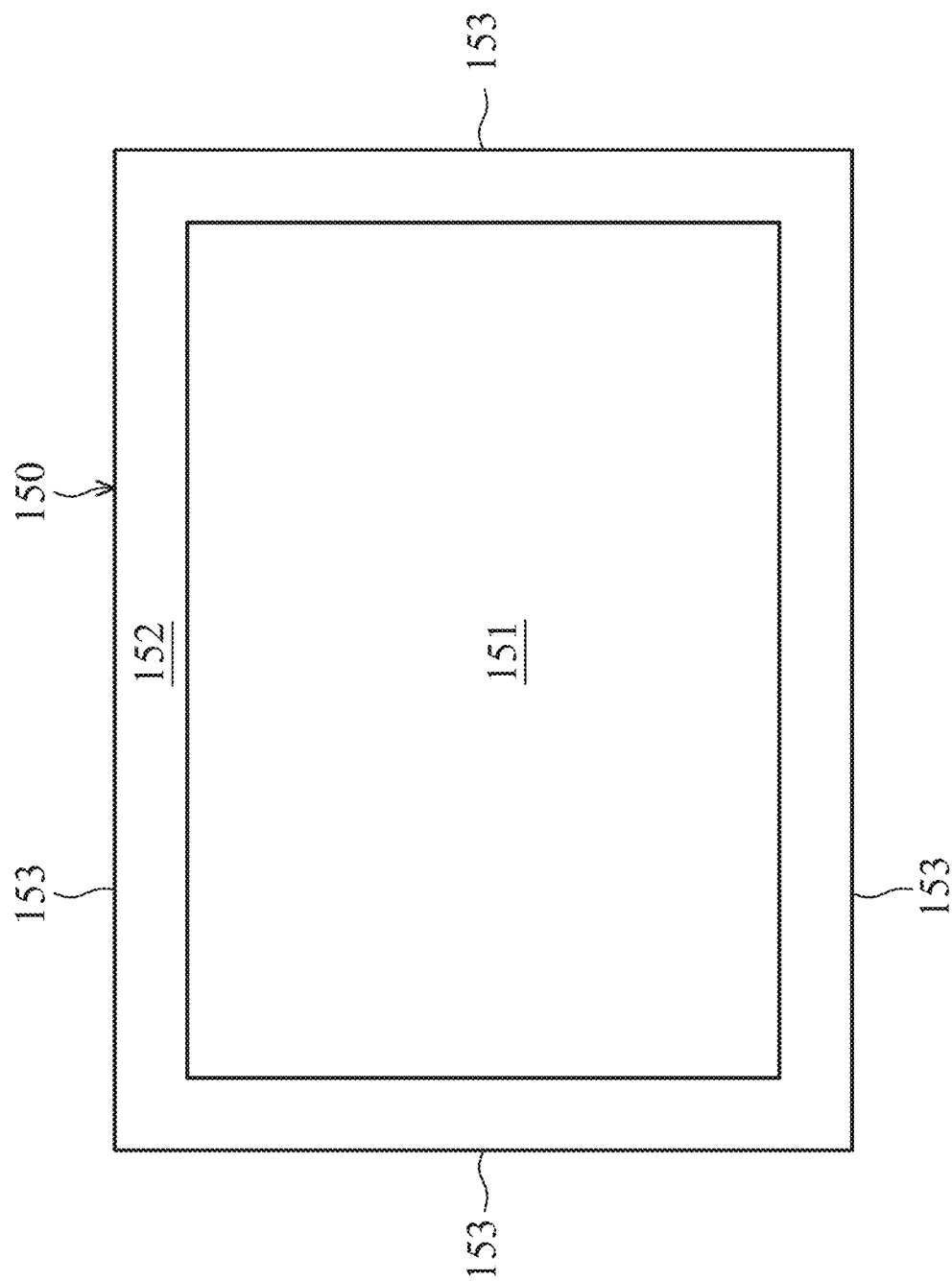
FIG. 2 is a plan view of the solar panel of FIG. 1, in accordance with some embodiments.

FIG. 1 is a cross-sectional view of a solar panel 100, in accordance with some embodiments. FIG. 2 is a plan view of the solar panel of FIG. 1, in accordance with some embodiments. The solar panel 100 includes a solar panel substrate 110, a back contact layer 120 on the substrate, an absorber layer 130 over the back contact layer 120, a buffer layer 140 over the absorber layer 130, and a front contact layer 150 comprising a bulk transparent conductive material 151 (such as a transparent conductive oxide, or TCO) over the buffer layer 130. The front contact layer 150 further comprises a seed layer 152 comprising a seed layer material along a plurality of outer edges 153 of the solar panel 100. According to some embodiments, the bulk TCO layer 151 and the seed TCO layer 152 are formed simultaneously in a single process, within a single chamber. Although a seed layer can be formed over the entire top surface of the buffer layer 140, good peeling resistance and good series resistance can be achieved by forming the seed layer 152 on the edge portions 153 of the substrate.

Substrate 110 can include any suitable solar cell substrate material, such as glass. In some embodiments, substrate 110 includes a glass substrate, such as soda lime glass, or a flexible metal foil or polymer (e.g., a polyimide, polyethylene terephthalate (PET), polyethylene naphthalene (PEN) polymeric hydrocarbons, cellulosic polymers, polycarbonates, polyethers, or others.). Other embodiments include still other substrate materials.

The back contact layer 120 includes any suitable back contact material, such as metal. In some embodiments, back contact layer 120 can include molybdenum (Mo), platinum (Pt), gold (Au), silver (Ag), nickel (Ni), or copper (Cu). Other embodiments include still other back contact materials. In some embodiments, the back contact layer 120 is from about 50 nm to about 2 μm thick. In some embodiments, the back contact layer is formed by sputtering.

The absorber layer 130 includes any suitable absorber material, such as a p-type semiconductor. In some embodiments, the absorber layer 130 can include a chalcopyrite-based material comprising, for example, Cu(In,Ga)Se2 (CIGS), cadmium telluride (CdTe), CuInSe2 (CIS), CuGaSe2 (CGS), Cu(In,Ga)Se2 (CIGS), Cu(In,Ga)(Se,S)2 (CIGSS), CdTe or amorphous silicon. Other embodiments include still other absorber materials. In some embodiments, the absorber layer 130 is from about 0.3 μm to about 3 μm thick. The absorber layer 130 can be applied using a variety of different process. For example, the CIGS precursors can be applied by sputtering. In other embodiments, one or more of the CIGS precursors are applied by evaporation.

Buffer layer 140 includes any suitable buffer material, such as n-type semiconductors. In some embodiments, buffer layer 140 can include cadmium sulphide (CdS), zinc sulphide (ZnS), zinc selenide (ZnSe), indium (III) sulfide (In2S3), indium selenide (In2Se3), or Zn1-xMgxO, (e.g., ZnO). Other embodiments include still other buffer materials. In some embodiments, the buffer layer 140 is from about 1 nm to about 500 nm thick. In some embodiments, the buffer layer 140 is applied by a wet process, such as chemical bath deposition (CBD).

In some embodiments, front contact layer 150 includes an annealed transparent conductive oxide (TCO) layer 151. In some embodiments, the TCO layer 151 is highly doped. For example, the charge carrier density of the TCO layer 151 can be from about $1 \times 10^{17}$ cm-3 to about $1 \times 10^{18}$ cm-3. The TCO material for the annealed TCO layer can include any suitable front contact material, such as metal oxides and metal oxide precursors. In some embodiments, the TCO material can include zinc oxide (ZnO), cadmium oxide (CdO), indium oxide ($In_2O_3$), tin dioxide ($SnO_2$), tantalum pentoxide ($Ta_2O_5$), gallium indium oxide (GaInO3), ($CdSb_2O_3$), or indium oxide (ITO). The TCO material can also be doped with a suitable dopant. In some embodiments, ZnO can be doped with any of aluminum (Al), gallium (Ga), boron (B), indium (In), yttrium (Y), scandium (Sc), fluorine (F), vanadium (V), silicon (Si), germanium (Ge), titanium (Ti), zirconium (Zr), hafnium (Hf), magnesium (Mg), arsenic (As), or hydrogen (H). In other embodiments, $SnO_2$ can be doped with antimony (Sb), F, As, niobium (Nb), or tantalum (Ta). In other embodiments, $In_2O_3$ can be doped with tin (Sn), Mo, Ta, tungsten (W), Zr, F, Ge, Nb, Hf, or Mg. In other embodiments, CdO can be doped with In or Sn. In other embodiments, GaInO3 can be doped with Sn or Ge. In other embodiments, $CdSb_2O_3$ can be doped with Y. In other embodiments, ITO can be doped with Sn. Other embodiments include still other TCO materials and corresponding dopants. In some embodiments, the front contact layer 110 is from about 5 nm to about 3 μm thick. In some embodiments, the front contact layer 151 is formed by metal organic chemical vapor deposition (MOCVD). In other embodiments, the front contact 151 is formed by sputtering.

In some embodiments a thin film TCO seed layer 152 surrounding a thicker bulk or main TCO front contact layer 151 over the buffer layer 140 increases adhesion of the front contact layer 151 to the buffer layer 140. Advantageously, the TCO front contact layer 151 is more resistant to peeling damage with the TCO seed layer 152 surrounding the front contact layer 151, improving the performance and reliability of the solar cell 100, particularly when the solar cell undergoes thermal cycling.

In some embodiments, the transparent conductive material of the front contact 151 and the seed layer material of the seed layer 152 are both formed by CVD using the same process gas. In some embodiments, the transparent conductive material of the front contact 151 and the seed layer material of the seed layer 152 have the same chemical composition as each other, and the transparent conductive material and the seed layer material have different microstructures from each other. For example, in some embodiments, the material of seed layer 152 has a smaller grain size than the TCO material of front contact layer 151. In some embodiments, the seed layer 152 has a crystal orientation different from a crystal orientation of the transparent conductive material.

In some embodiments, the seed layer 152 has a thickness 162 less than a thickness 163 of the transparent conductive material of the front contact layer 151. For example, in some embodiments, the transparent conductive material of the front contact 151 has a first thickness, the seed layer 152 has a second thickness, and a ratio of the first thickness to the second thickness is in a range from 2:1 to 30:1.

In some embodiments, the transparent conductive material has a first width 161, the seed layer material has a second width 160 at the outer edges, and a ratio of the first width to the second width is in a range from about 6:1 to about 17:1. Thus, about 80% or more of the total area of the front contact 150 is occupied by the main TCO material in the TCO layer 151, and about 20% or less of the total area is occupied by the seed layer 152. In some embodiments, about 95-97% of the total area of the front contact 150 is occupied by the main TCO material in the TCO layer 151, and about 3-5% of the total area is occupied by the seed layer 152. The material of seed layer 152 has a higher resistivity than the material of the main TCO layer 151. Because the seed layer occupies a relatively small fraction of the total solar panel area, sufficient to avoid TCO peeling, the benefits of the seed layer can be achieved without compromising the series resistance (Rs) of the entire solar panel 100.

In some embodiments, the adhesion improvement and benefits are achieved by forming the TCO seed layer 152 in a deposition process performed at lower temperatures than those used to form the TCO front contact layer 151. This produces a seed layer 152 with a different microstructure having a finer or smaller grain size than the main TCO front contact layer 151. The smaller grain size is associated with imparting the increased adhesion properties to the main TCO layer 151. Accordingly, embodiments of the present disclosure have a TCO seed layer 152 along the periphery of the solar panel 100, with a different grain size than the main TCO front contact layer 151.

Figure 3:
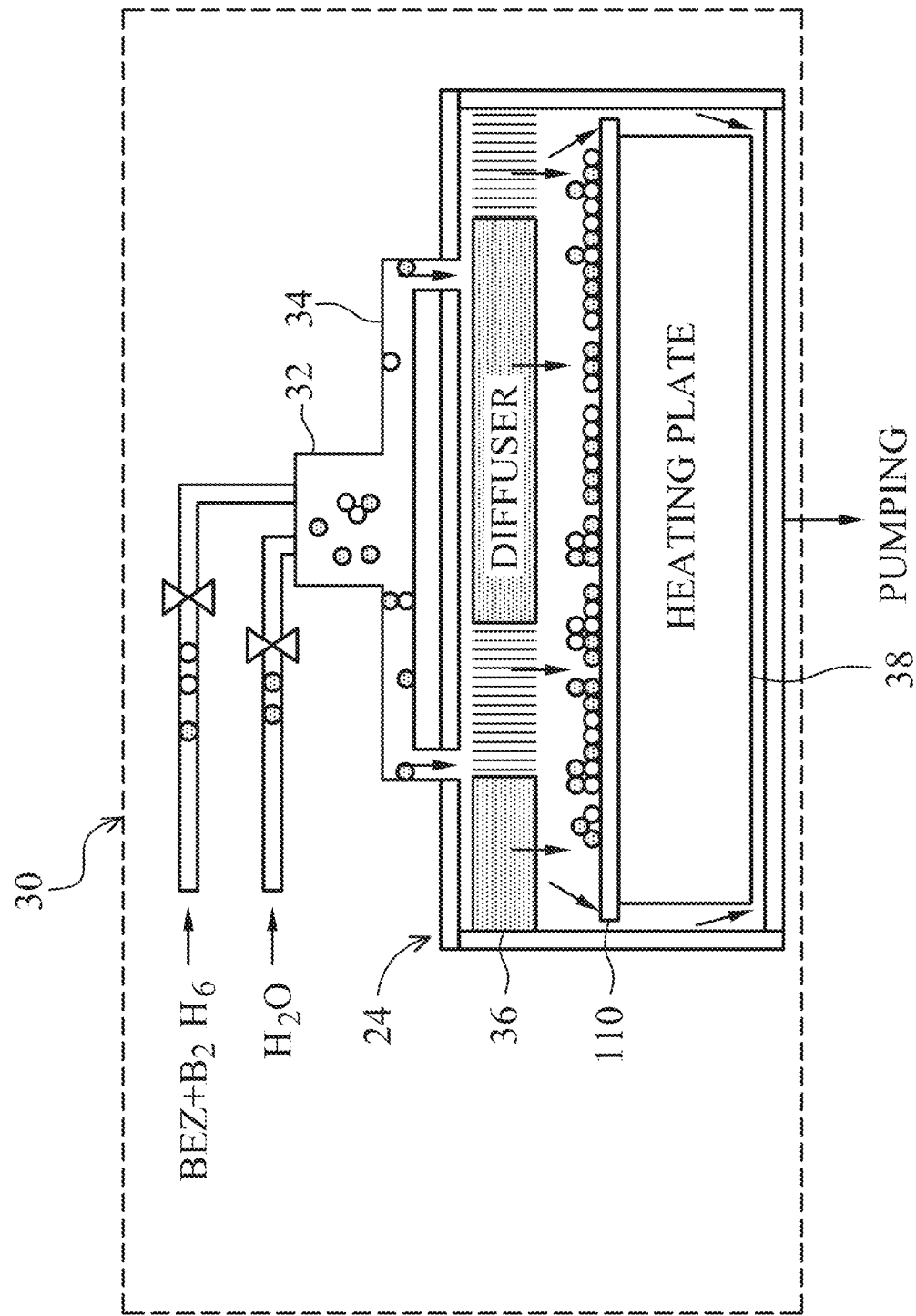
FIG. 3 is a schematic diagram of an apparatus for fabricating the solar panel of FIG. 1, in accordance with some embodiments.

FIG. 3 is a schematic diagram of an apparatus for fabricating the solar panel 100 of FIG. 1, in accordance with some embodiments. The apparatus can be a CVD cluster tool or other tool having a process reaction chamber 24 for forming the TCO seed layer 152 and main top electrode layer 151 over the substrate 110. The process reaction chamber 24 includes a process gas supply system 30 which introduces the process gases containing the chemical TCO layer precursors (e.g. without limitation DEZ for formation of ZnO TCO material), dopant in some embodiments for seed layer 152 (optional) and main bulk TCO layer 151, and other process gases into a mixing chamber 32 of reaction chamber 24. Gas flows from the mixing chamber 32 through a header tube 34 into a gas injection diffuser 36 located at the top of reaction chamber 24. Diffuser 36 (also known by the term "showerhead" in the art) contains a plurality of openings through which gas is uniformly distributed throughout the reaction chamber. A heating susceptor or heating plate 38 is disposed in reaction chamber 24. Heating plate 38 is configured to support and heat substrate 110 during the film deposition process. Buffer chamber 22 includes a heating plate 38 and can include an insert gas supply (e.g. nitrogen). In some embodiments, a buffer chamber (not shown) is used for preheating the temperature of the solar cell substrate 110 to be processed in the reaction chamber 24 for increasing the temperature of the substrate from room temperature to approximately or just below the process temperature of the substrate to be used in the reaction chamber 24, thereby shortening the process time in the reaction chamber and throughput of the CVD tool.

In some embodiments, for fabricating the seed layer TCO 152, the temperature of the edges of the substrate should be in a range from about 100 degrees C. to about 140 degrees C. In some embodiments for forming the bulk TCO 151, the temperature of the interior of the substrate 110 should be from about 150 degrees C. to about 200 degrees C. According to some embodiments described below, the bulk TCO layer 151 and the seed layer TCO 152 for a given solar panel 100 are formed simultaneously in a single process, in a single process chamber 24.

Figure 4:
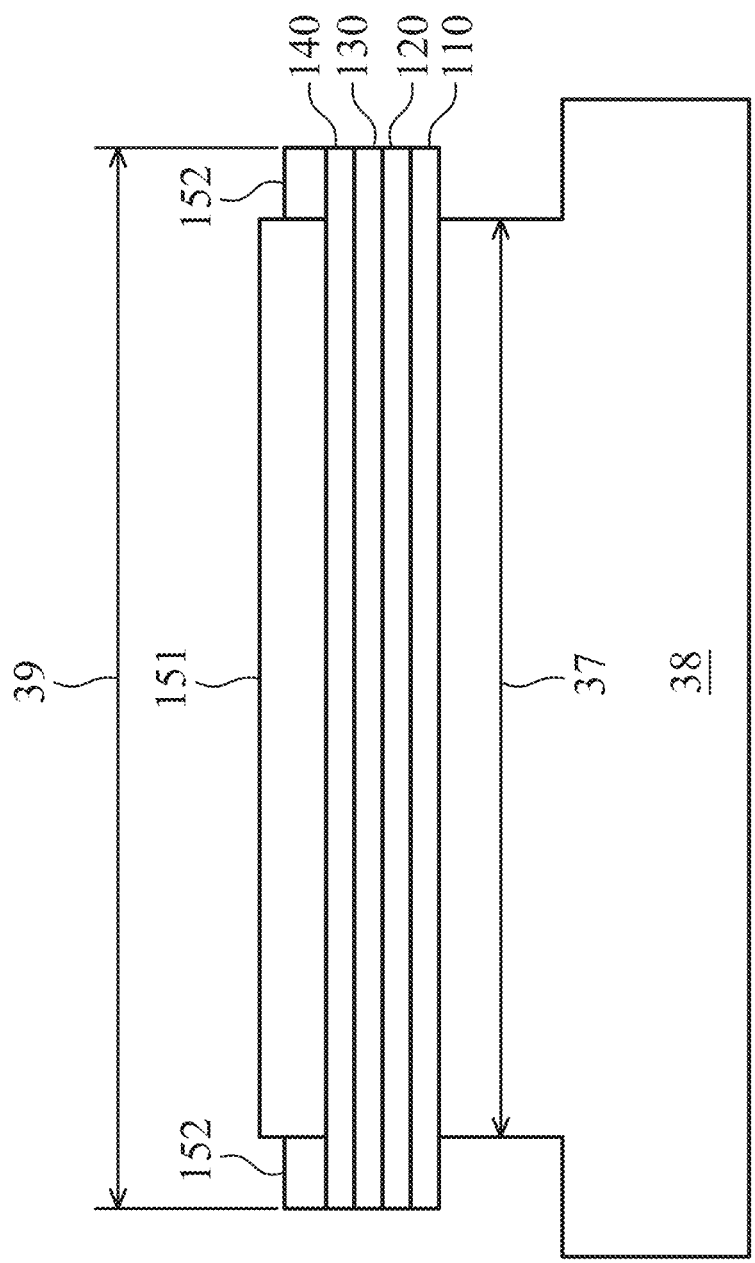
FIG. 4 is a cross-sectional view of the heating plate shown in FIG. 3, with the solar panel of FIG. 1 thereon, in accordance with some embodiments.

FIG. 4 is a cross-sectional view of the heating plate 38 shown in FIG. 3, with the solar panel 110 of FIG. 1 thereon during front contact formation, in accordance with some embodiments. The heating plate 38 has a top surface for supporting the substrate 110, and for conducting heat to the bottom of the substrate 110. The edges 153 of the substrate 110 do not touch the heating plate directly, and thus have a lower temperature than the center portion of the substrate, when the heating plate 38 heats the substrate. The substrate conducts some heat from the interior to the edges 153, so the temperature of the edges rises when the heating plate 38 heats the substrate 110, but there is a temperature differential.

The dimensions of the heating plate 38 are smaller than the dimensions of the substrate 110. The heater plate 38 has a width 37 that is smaller than a width 39 of the solar panel substrate 110 and adapted to underlie the center of the solar panel substrate 110. In some embodiments, the heating plate 38 has a first width, the substrate extends beyond the heating plate by a second width, and a ratio of the first width to the second width is in a range from 6:1 to 17:1. Similarly, the length of the heater plate (extending into the page) is smaller than the length of the solar panel substrate 110.

In order to form the front contact, the substrate 110 is provided in the process chamber 24 at the desired temperature, with the absorber layer 130 and buffer layer 140 already formed, and the P2 scribe lines (not shown) already completed. In some embodiments, the TCO layer 150 is formed by heating a solar panel substrate 110 to the desired front contact formation temperature in the process chamber 24. In other embodiments, the solar panel substrate 110 is preheated in a buffer chamber (not shown) and then transferred to the process chamber 24.

Figure 5:
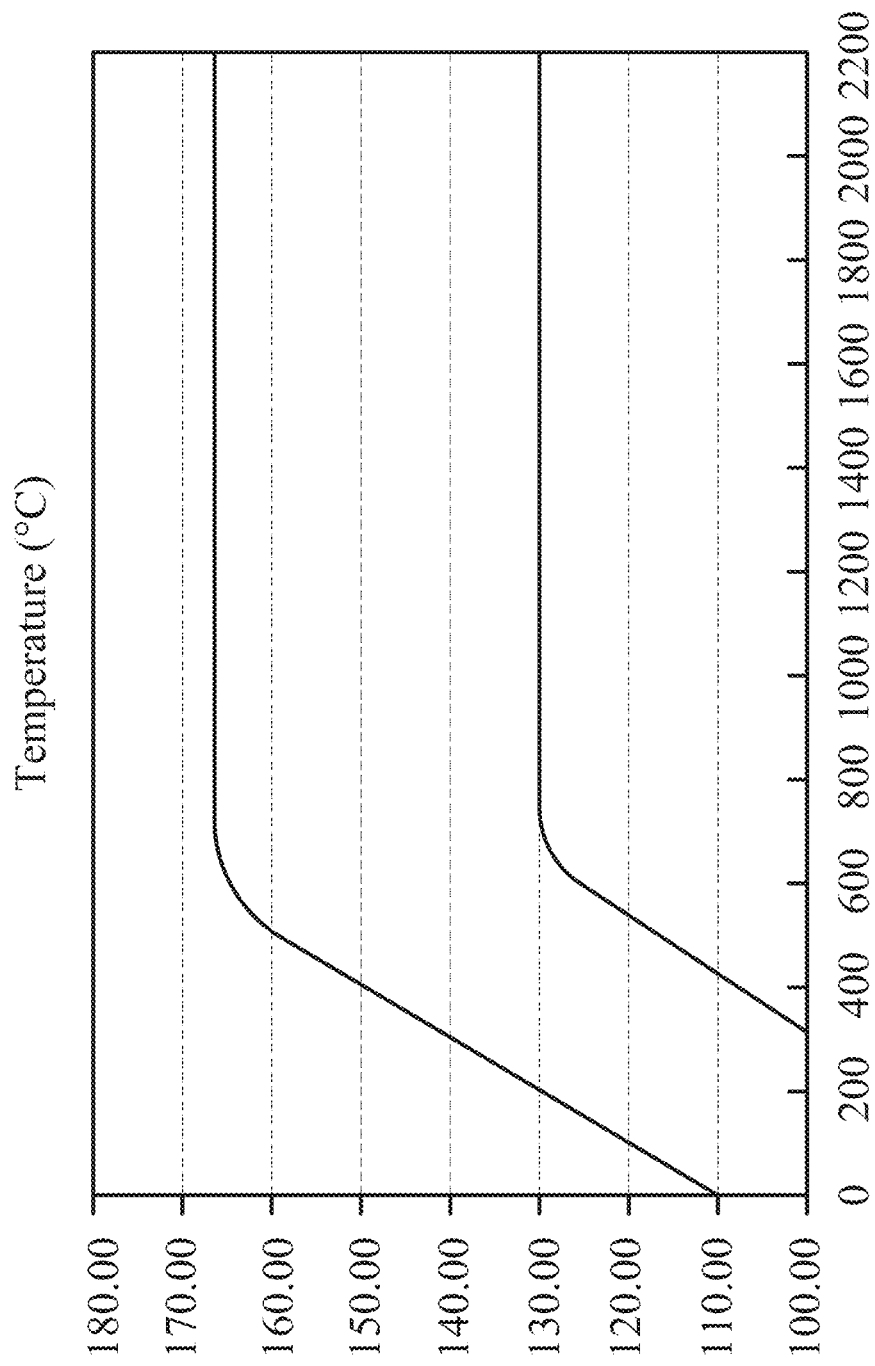
FIG. 5 is a diagram of the temperature of the solar panel of FIG. 4 versus time, in accordance with some embodiments.

FIG. 5 is a diagram of the temperature of the solar panel of FIG. 4 versus time, in accordance with some embodiments.

As shown in FIG. 5, the temperature at the edges 153 of the substrate (which are not heated by the plate 38) is lower than the temperature of the interior portion of the substrate 110. In some embodiments, within about 600 seconds, the temperature of the interior of substrate 110 reaches about 165 degrees C., and the temperature at the edges 153 reaches about 130 degrees C. At these respective temperatures, a main TCO front contact layer 151 having a thickness of 1000 nm to 3000 nm is formed, and the seed layer 152 having a thickness of 100 nm to 500 nm is formed. In other embodiments, the desired deposition temperatures for forming the front contact layer 151 and seed layer 152 for other TCO materials are determined experimentally.

Once the desired substrate process temperatures are reached, the TCO layer formation process is started by introducing the process gases into reaction chamber 24. Because of the temperature differential, the interior of the substrate and the edge portions 153 form crystals of the TCO material with different grain size and orientation. During the same period of time, the thickness of the seed layer 152 deposited on the edges 153 of the substrate by a chemical vapor deposition (CVD) process is less than the thickness of the material 151 deposited over the interior of the substrate 110. The TCO deposition process continues for a period of time sufficient to form the desired thickness of the bulk TCO layer 151 in the center (interior) portion of the solar panel. Thus, the TCO seed layer 152 has a thickness less than the bulk main TCO top electrode layer 151. In some embodiments, without limitation, TCO seed layer 152 has a thickness of about 100 nm to about 500 nm. This is sufficient for increasing the adhesion properties of the main TCO top electrode layer 151 to reduce or eliminate peeling. Simultaneously, TCO top electrode layer 151 is deposited with a thickness of from about 1000 nm to about 3000 nm for low resistance and good current collection performance. Accordingly, in some embodiments, TCO seed layer 152 has a thickness that is less than half of the main TCO layer 151.

Accordingly, in some embodiments, it is desirable for the thickness of TCO seed layer 152 to be less than that of TCO top electrode layer 151, since the lower temperature formed seed layer 152 tends to have a higher resistivity than the bulk top electrode layer 151, which inhibits current flow and reduces solar cell performance. The TCO seed layer 152 therefore should have a thickness sufficient to improve adhesion of the bulk TCO layer 151 to the absorber layer 130, while not being so thick as to degrade solar cell performance.

When completed, the partially completed thin film solar cell would appear as shown in FIG. 1 and described above.

Although formation of the TCO seed layer 152 and top electrode layer 151 are described herein with respect to using a CVD process in one non-limiting example, other suitable film formation processes used in the semiconductor art can be used including, without limitation atomic layer deposition (ALD) and physical vapor deposition (PVD) as two examples.

An advantage of the foregoing process according to the present disclosure is that the TCO seed layer 160 and top electrode layer 150 are both formed in the same machine, and are comprised of the same material. This creates economies in the solar cell formation fabrication process flow and reduces costs.

The process described herein reduces total processing time. The formation of the seed layer 152 and the main front contact 151 are performed simultaneously, reducing total deposition time in the chamber. Also, there is no need to incur transfer time moving the substrate 110 between a first process chamber for forming layer 152 and a second process chamber for forming layer 151. Further, because both the TCO seed layer 152 and top electrode layer 151 can be formed in a thin film deposition tool having a single process reaction chamber 24 without a buffer chamber for preheating the substrate, there is no need to incur transfer time moving the substrate 110 between a buffer chamber and a process chamber.

Figure 6:
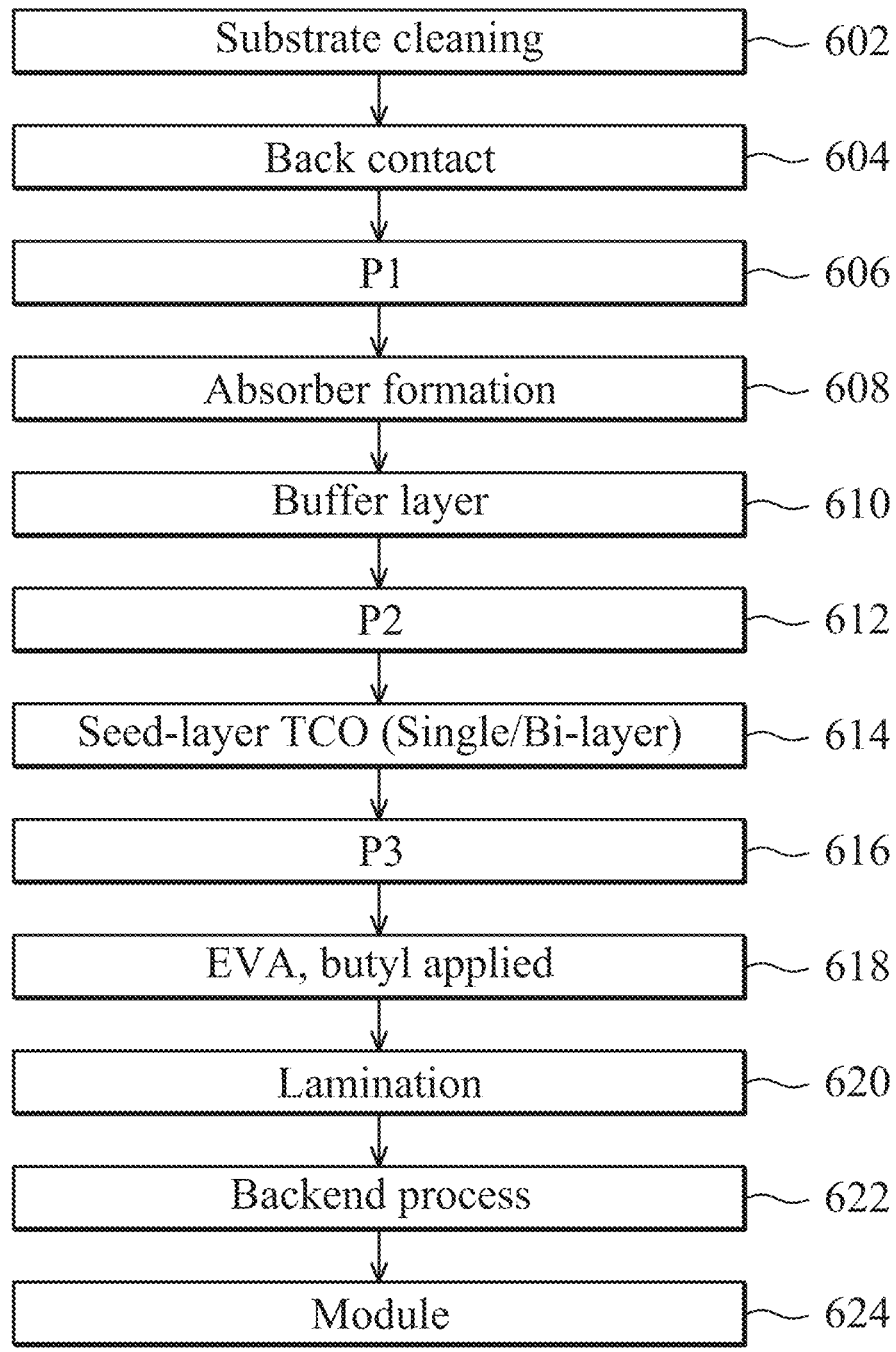
FIG. 6 is a flow chart of a method of making the solar panel of FIG. 1, using the apparatus of FIG. 3, in accordance with some embodiments.

FIG. 6 is a flow chart of a method of making the solar panel 100 of FIG. 1, using the apparatus 24 of FIG. 3, in accordance with some embodiments.

At step 602, the substrate is cleaned. In some embodiments, substrate 110 is cleaned by using detergent or chemical in either brushing tool or ultrasonic cleaning tool.

At step 604, back electrode layer 120 is then formed on a substrate 110 by sputtering, atomic layer deposition (ALD), chemical vapor deposition (CVD), or other suitable techniques.

At step 606, the P1 patterned scribe lines (not shown) are next formed in bottom electrode layer 120 to expose the top surface of substrate 110 as shown. Any suitable scribing method can be used such as, without limitation, mechanical scribing with a stylus or laser scribing.

At step 608, the p-type doped semiconductor light absorber layer 130 is next formed on top of bottom electrode layer 120. The absorber layer 130 material further fills the P1 scribe line and contacts the exposed top surface of substrate 110 to interconnect layer 130 to the substrate. Absorber layer 130 formed of CIGS can be formed by any suitable vacuum or non-vacuum process. Such processes include, without limitation, selenization, sulfurization after selenization ("SAS"), evaporation, sputtering electrodeposition, chemical vapor deposition, or ink spraying or the like.

At step 610, an n-type buffer layer 140, which can be CdS for example, is then formed on absorber layer 130 to create an electrically active n-p junction. Buffer layer 140 can be formed by an electrolyte chemical bath deposition (CBD) process for forming such layers using an electrolyte solution that contains sulfur.

At step 612, the P2 scribe lines (not shown) are next cut through the absorber layer 130 to expose the top surface of the bottom electrode 120 within the open scribe line or channel. Any suitable method can be used to cut the P2 scribe line, including without limitation mechanical (e.g. cutting stylus) or laser scribing. The P2 scribe line will subsequently be filled with a conductive material from top electrode layer 150 to interconnect the top electrode to the bottom electrode layer 120.

At step 614, the front contact 150, including the seed layer 152 and the main front contact (bulk TCO) 151 are formed, in the manner described above with reference to FIGS. 1-3. The step of forming the front contact 150 includes heating a center portion of the substrate 110 using a heating plate 38 that is smaller in a width dimension than the solar cell substrate 110. A center portion of the substrate 110 is heated without directly applying heat to the outer edges 110e of the solar panel. The center portion of the substrate 110 is heated to a range of about 150 degrees C. to about 200 degrees C., while the outer edges are in a temperature range from about 100 degrees C. to about 140 degrees C. The process gas is supplied, and thin films are formed with respectively different grain structures on the interior and edges of the substrate, due to the temperature differential. As a result, the transparent conductive material and the seed layer material are applied on the buffer layer simultaneously. The top electrode 150 is thus configured to carry the collected charge to an external circuit. The P2 scribe line is also at least partially filled with the TCO material to form an electrical connection between the top electrode layer 150 of one solar cell and the bottom electrode 120 of the adjacent solar cell within the solar panel 100, creating an electron flow path.

At step 616, following formation of the TCO seed layer 152 and top electrode layer 151 described above, the P3 scribe line (not shown) is formed. The P3 scribe line extends through (from top to bottom) TCO top electrode layer 150, buffer layer 140, absorber layer 130, and the bottom electrode layer 120 down to the top of substrate 110.

At step 618, a combination of ethylene vinyl acetate (EVA) and butyl are applied to seal the solar panel 100. The EVA and butyl encapsulant is applied directly onto the top electrode layer 150 in some embodiments. The EVA/butyl act as a suitable light transmitting encapsulant.

At step 620, heat and pressure are applied to laminate the EVA/butyl film to the front contact 150.

At step 622, additional back end of line processes can be performed. This can include laminating a top cover glass onto solar cell structure to protect the top electrode layer 150.

At step 624, suitable further back end processes can then be completed, which can include forming front conductive grid contacts and one or more anti-reflective coatings (not shown) above top electrode 150. The grid contacts protrude upwards through and beyond the top surface of any anti-reflective coatings for connection to external circuits. The solar cell fabrication process produces a finished and complete thin film solar cell module 100.

Figure 7:
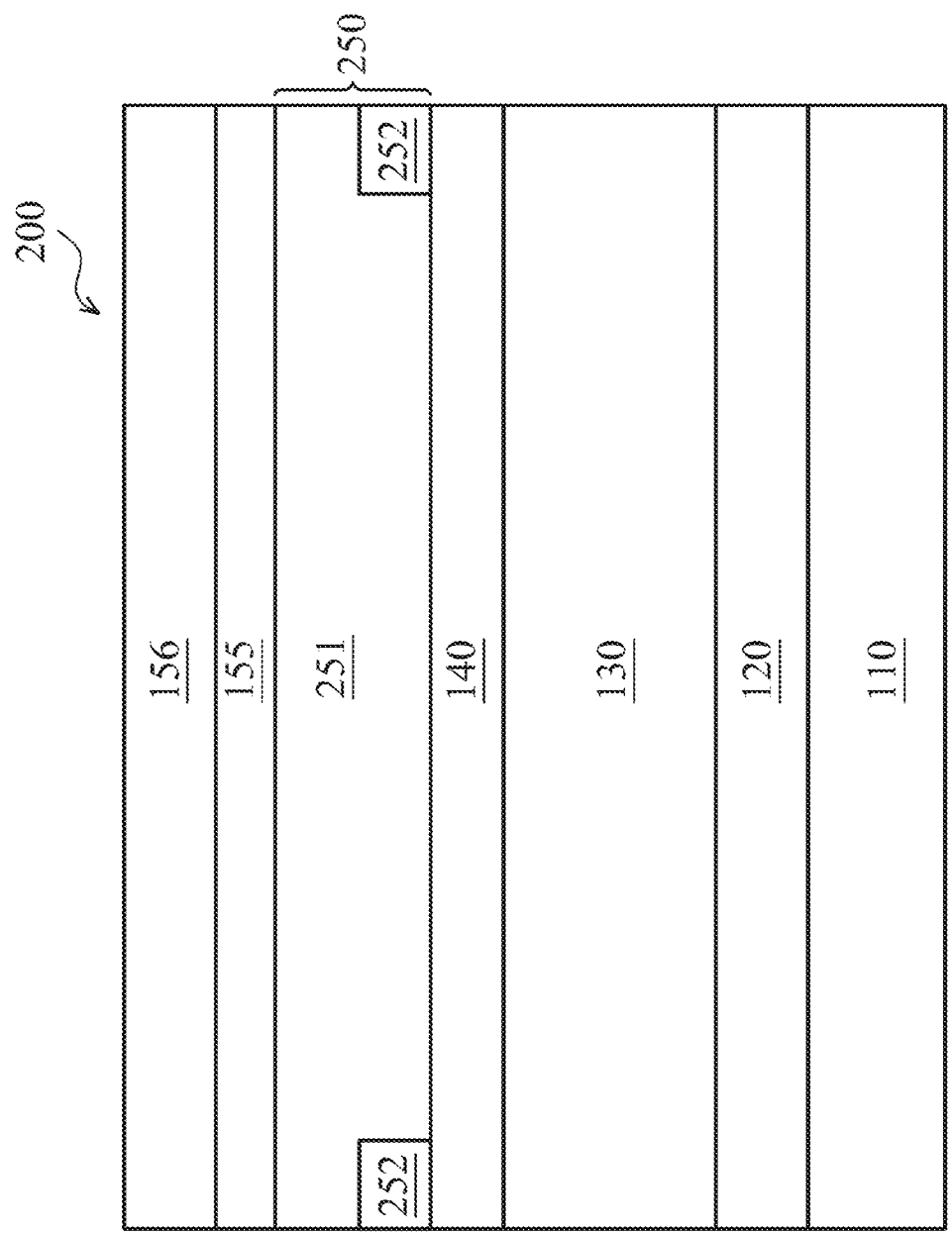
FIG. 7 is a cross-sectional view of a solar panel, in accordance with some embodiments.

FIG. 7 is a cross-sectional view of a solar panel 200, in accordance with some embodiments. The solar panel 200 includes a solar panel substrate 110, a back contact layer 120 on the substrate, an absorber layer 130 over the back contact layer 120, a buffer layer 140 over the absorber layer 130, and a front contact layer 250 comprising a bulk transparent conductive material 251 (such as a transparent conductive oxide, or TCO) over the buffer layer 130. The substrate 110, back contact 120, absorber 130, and buffer layer 140 can be the same as described above with reference to FIGS. 1-6. The front contact layer 250 comprises a seed layer 252 comprising a seed layer material along a plurality of outer edges 153 of the solar panel 200. The main front contact layer 251 further comprises an edge layer 251e of the transparent conductive material extending out to the edges of the solar panel 200, overlying the seed layer 252 at the edges of the substrate. According to some embodiments, the bulk TCO layer 251 and the seed TCO layer 252 are formed in a single process, within a single chamber.

Because the edges of the solar panel 200 have the TCO edge layer 251e overlying the seed layer 252, a parallel conductive path is provided to further reduce the series resistance of the TCO layer 250.

Figure 8:
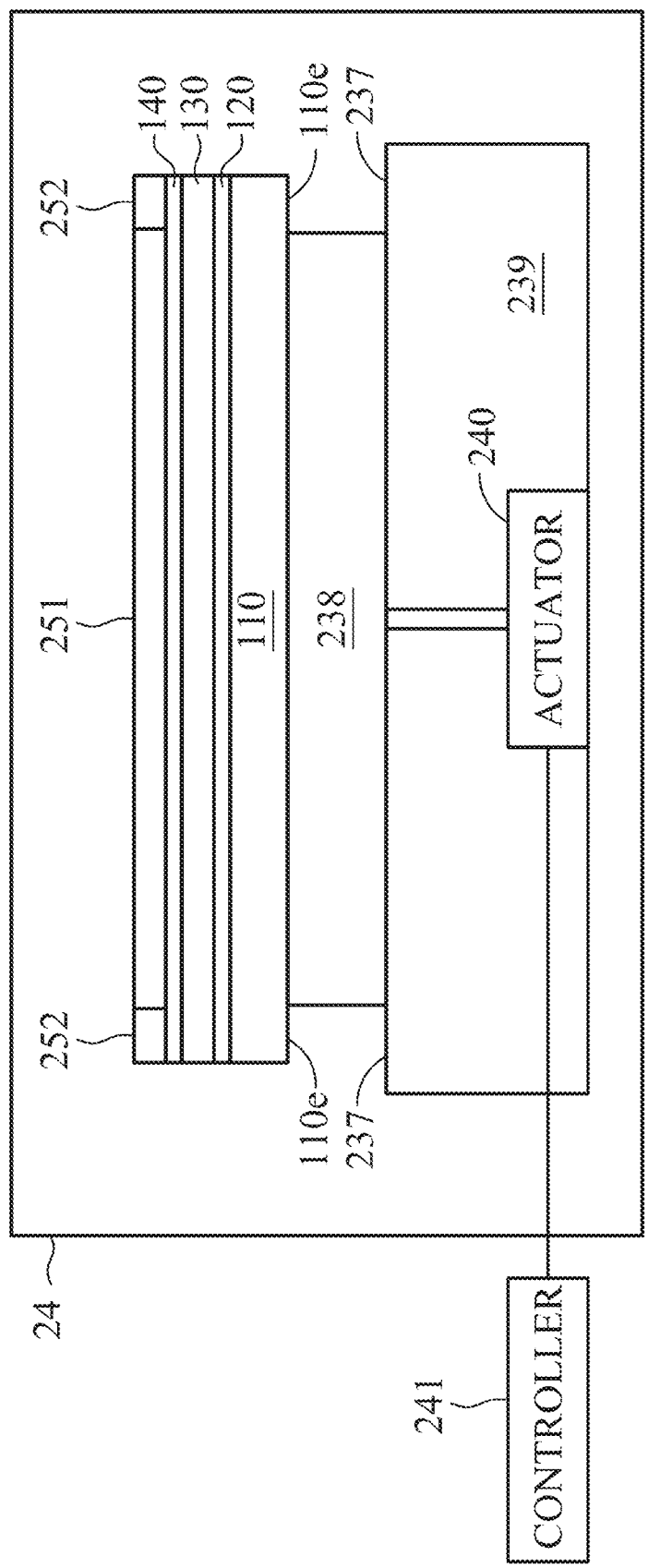
FIG. 8 is a schematic diagram of an apparatus for fabricating the solar panel of FIG. 7, with the heating plate in a first position in accordance with some embodiments.
Figure 9:
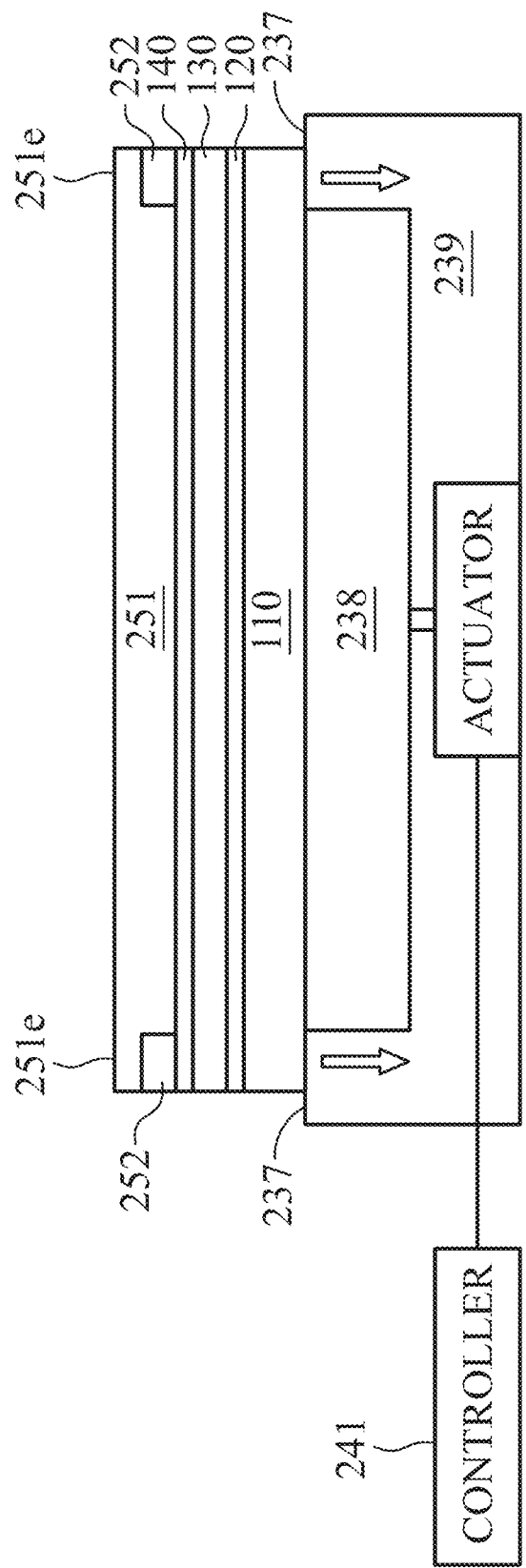
FIG. 9 shows the apparatus of FIG. 8 with the heating plate in a second position in accordance with some embodiments.

FIG. 8 is a schematic diagram of an apparatus for fabricating the solar panel of FIG. 7. The apparatus includes an actuator 240 configured to raise and lower one of the group consisting of a first heating plate 238 and a second heating plate 237 relative to the other of the group consisting of the first heating plate and the second heating plate. In the example, the first heating plate 238 is movable, and the second heating plate 237 is fixed, but in other embodiments (not shown) the first heating plate 238 is fixed and the second heating plate 237 can be lowered. FIG. 8 shows the apparatus with the heating plate 238 in a first position in accordance with some embodiments. FIG. 9 shows the apparatus of FIG. 8 with the heating plate in a second position.

The apparatus includes a first heater plate 238 within the chamber 24. The first heater plate 238 has a width that is smaller than a width of the solar panel substrate 110 and adapted to underlie the center (interior portion) of the solar panel substrate 110.

A second heater plate 237 is adjacent the first heater plate 238. The second heater plate 237 is positioned to underlie the edges 110e of the substrate 110, such that the first heater plate 238 and second heater plate 237 together underlie the center and edges 110e of the solar panel substrate 110.

In some embodiments, the first heating plate 238 has a first width, the second heating plate 237 has a second width extending from an inner edge thereof to an outer edge thereof, and a ratio of the first width to the second width is in a range from 6:1 to 17:1. In FIG. 9, the second heating plate 237 has an outer edge that extends slightly beyond the outer edge of the substrate, and the width of the second heating plate is slightly larger than the width of the substrate. In other embodiments (not shown), the width of the second heating plate can be the same as the width of the substrate 110.

The apparatus is operable in a first mode (FIG. 8) for directly heating the center of the solar panel substrate 110 but not the edges 110e, and the apparatus is operable in a second mode (FIG. 9) for directly heating the center and edges 110e of the solar panel substrate 110.

Figure 10:
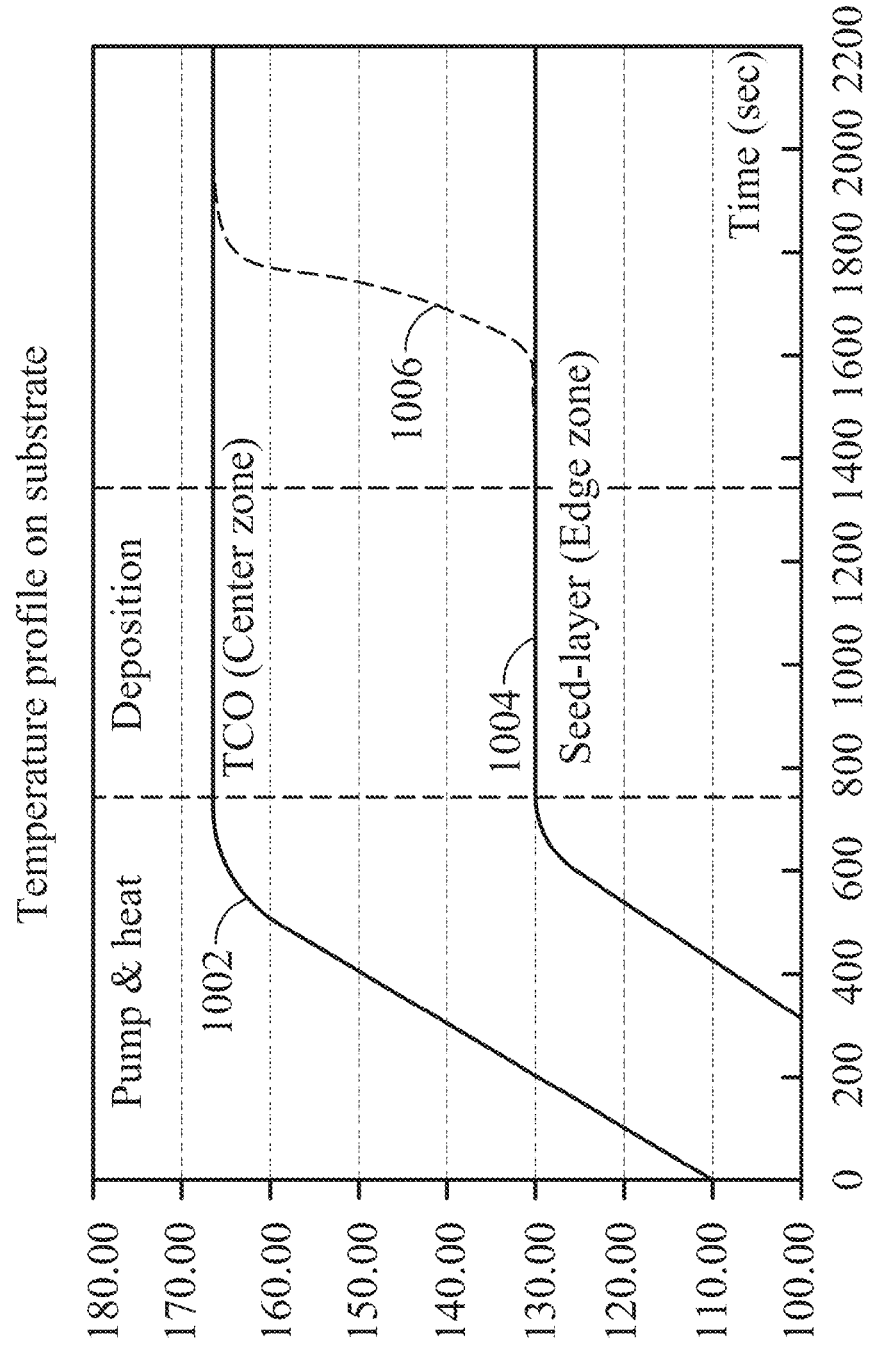
FIG. 10 is a diagram of the temperature of the solar panel of FIG. 7 versus time, in accordance with some embodiments.

FIG. 10 is a diagram of a temperature profile to be achieved by successively actuating the first heating plate 238 to the raised and lowered positions. Curve 1004 shows a desired temperature profile for the seed layer. By about 750 seconds after heating begins, the edges 110e have a temperature of 130 degrees C. for forming the seed layer 152, and the center (interior) of the substrate has a temperature of about 165 degrees C. for forming the main front contact TCO 151. At about time 1500, the temperature at the edges 110e is increased up to about the same temperature as the interior of the solar panel substrate 110, so that the edge layer 251e of bulk TCO having the larger grain size (with lower resistance) is formed above the seed layer 252.

Figure 11:
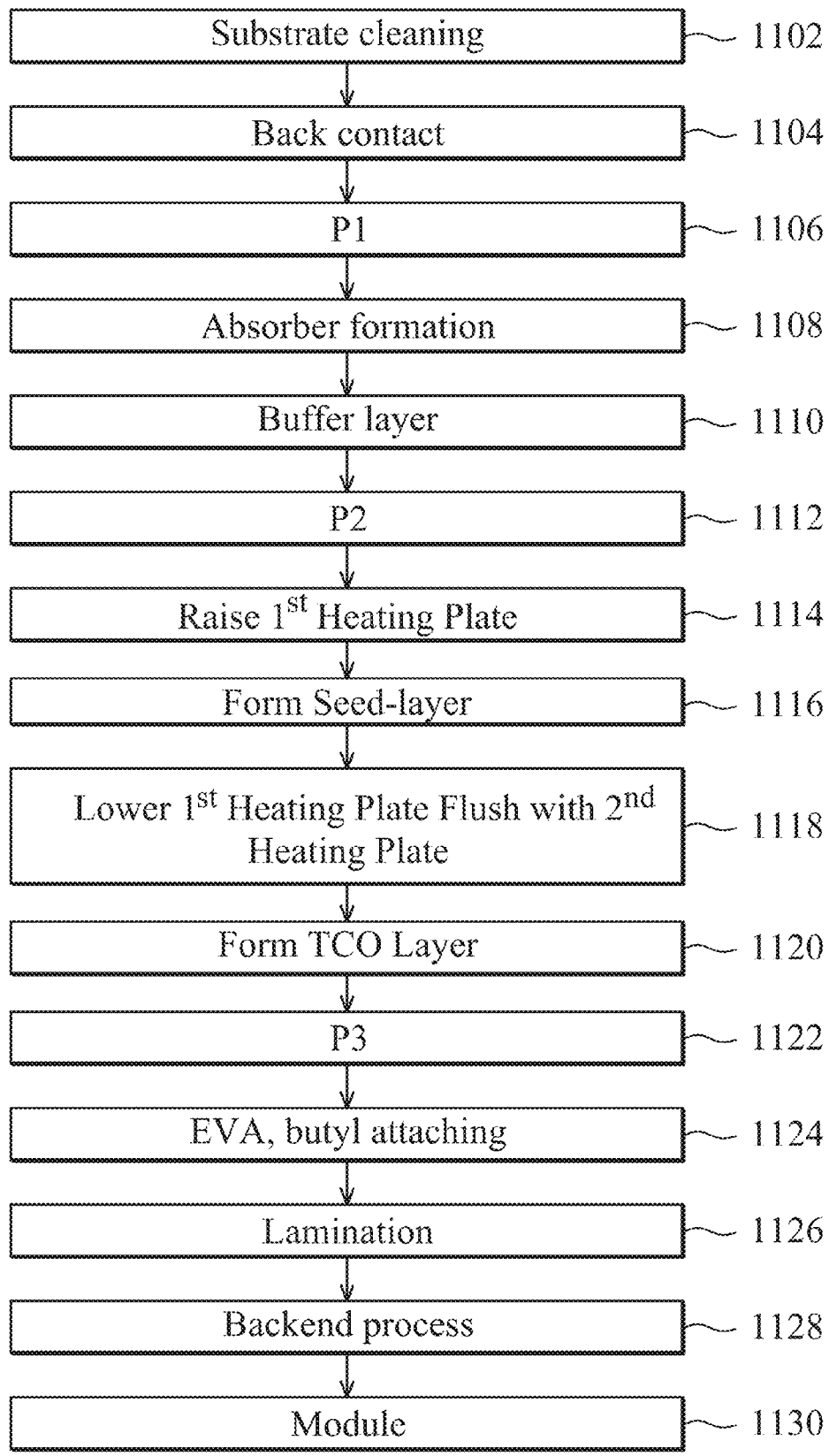
FIG. 11 is a flow chart of a method of making the solar panel of FIG. 7, using the apparatus of FIGS. 8 and 9, in accordance with some embodiments.

FIG. 11 is a flow chart of a method of making the solar panel of FIG. 7, using the apparatus of FIGS. 8 and 9, in accordance with some embodiments.

At step 1102, the substrate is cleaned. In some embodiments, substrate 110 is cleaned by using detergent or chemical in either brushing tool or ultrasonic cleaning tool.

At step 1104, back electrode layer 120 is then formed on a substrate 110 by sputtering, atomic layer deposition (ALD), chemical vapor deposition (CVD), or other suitable techniques.

At step 1106, the P1 patterned scribe lines (not shown) are next formed in bottom electrode layer 120 to expose the top surface of substrate 110 as shown. Any suitable scribing method can be used such as, without limitation, mechanical scribing with a stylus or laser scribing.

At step 1108, the p-type doped semiconductor light absorber layer 130 is next formed on top of bottom electrode layer 120. The absorber layer 130 material further fills the P1 scribe line and contacts the exposed top surface of substrate 110 to interconnect layer 130 to the substrate. Absorber layer 130 formed of CIGS can be formed by any suitable vacuum or non-vacuum process. Such processes include, without limitation, selenization, sulfurization after selenization ("SAS"), evaporation, sputtering electrodeposition, chemical vapor deposition, or ink spraying or the like.

At step 1110, an n-type buffer layer 140, which can be CdS for example, is then formed on absorber layer 130 to create an electrically active n-p junction. Buffer layer 140 can be formed by an electrolyte chemical bath deposition (CBD) process for forming such layers using an electrolyte solution that contains sulfur.

At step 1112, the P2 scribe lines (not shown) are next cut through the absorber layer 130 to expose the top surface of the bottom electrode 120 within the open scribe line or channel.

Any suitable method can be used to cut the P2 scribe line, including without limitation mechanical (e.g. cutting stylus) or laser scribing. The P2 scribe line will subsequently be filled with a conductive material from top electrode layer 150 to interconnect the top electrode to the bottom electrode layer 120.

At step 1114, the controller 241 causes the actuator 240 to raise the first heating plate 238 that is smaller in a width dimension than the substrate 110, while the substrate is on the first heating plate.

At step 1116, the transparent conductive material is applied over the buffer layer while heating a center portion of the substrate 110 using a heating plate 38 that is smaller in a width dimension than the solar cell substrate 110. A center portion of the substrate 110 is heated without directly applying heat to the outer edges 110e of the solar panel 110. The center portion of the substrate 110 is heated to a range of about 150 degrees C. to about 200 degrees C., while the outer edges are in a temperature range from about 100 degrees C. to about 140 degrees C. The process gas is supplied, and thin films are formed with respectively different grain structures on the interior and edges of the substrate, due to the temperature differential. As a result, the transparent conductive material and the seed layer material are applied on the buffer layer simultaneously.

At step 1118, the first heating plate 238 is lowered until a top surface of the first heating plate 238 is flush with a top surface of a second heating plate 237 under the edge 110e of the substrate. From this time onward, the center portion of the substrate 110 and the edges 110e of the substrate are both heated by the first heating plate 238 and second heating plate 237, respectively.

At step 1120, additional process gas (TCO material) is applied while heating the center of the substrate 110 with the first heating plate 238 and heating the edge 110e of the substrate with the second heating plate 237 simultaneously.

The top electrode 150 is thus configured to carry the collected charge to an external circuit. The P2 scribe line is also at least partially filled with the TCO material to form an electrical connection between the top electrode layer 150 of one solar cell and the bottom electrode 120 of the adjacent solar cell within the solar panel 100, creating an electron flow path.

At step 1122, following formation of the TCO seed layer 152 and top electrode layer 151 described above, the P3 scribe line (not shown) is formed. The P3 scribe line extends through (from top to bottom) TCO top electrode layer 150, buffer layer 140, absorber layer 130, and the bottom electrode layer 120 down to the top of substrate 110.

At step 1124, a combination of ethylene vinyl acetate (EVA) and butyl are applied to seal the solar panel 100. The EVA and butyl encapsulant is applied directly onto the top electrode layer 150 in some embodiments. The EVA/butyl act as a suitable light transmitting encapsulant.

At step 1126, heat and pressure are applied to laminate the EVA/butyl film to the front contact 150.

At step 1128, additional back end of line processes can be performed. This can include laminating a top cover glass onto solar cell structure to protect the top electrode layer 150.

At step 1130, suitable further back end processes can then be completed, which can include forming front conductive grid contacts and one or more anti-reflective coatings (not shown) above top electrode 150. The grid contacts protrude upwards through and beyond the top surface of any anti-reflective coatings for connection to external circuits. The solar cell fabrication process produces a finished and complete thin film solar cell module 100.

Figure 12A:
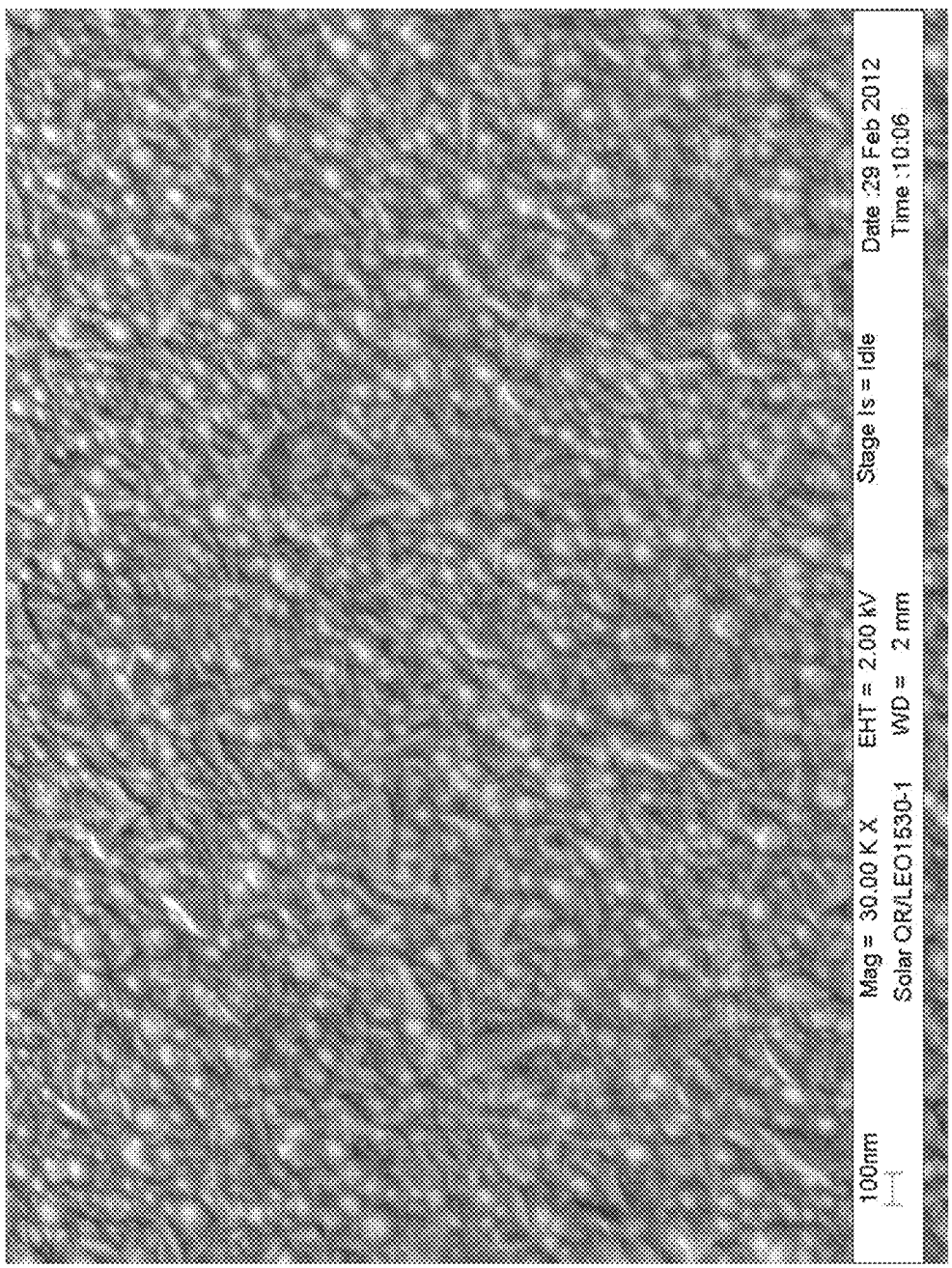
FIGS. 12A and 12B are plan and cross-sectional views of the seed layer microstructure of the solar panel of FIG. 1 or FIG. 7, in accordance with some embodiments.
Figure 12B:
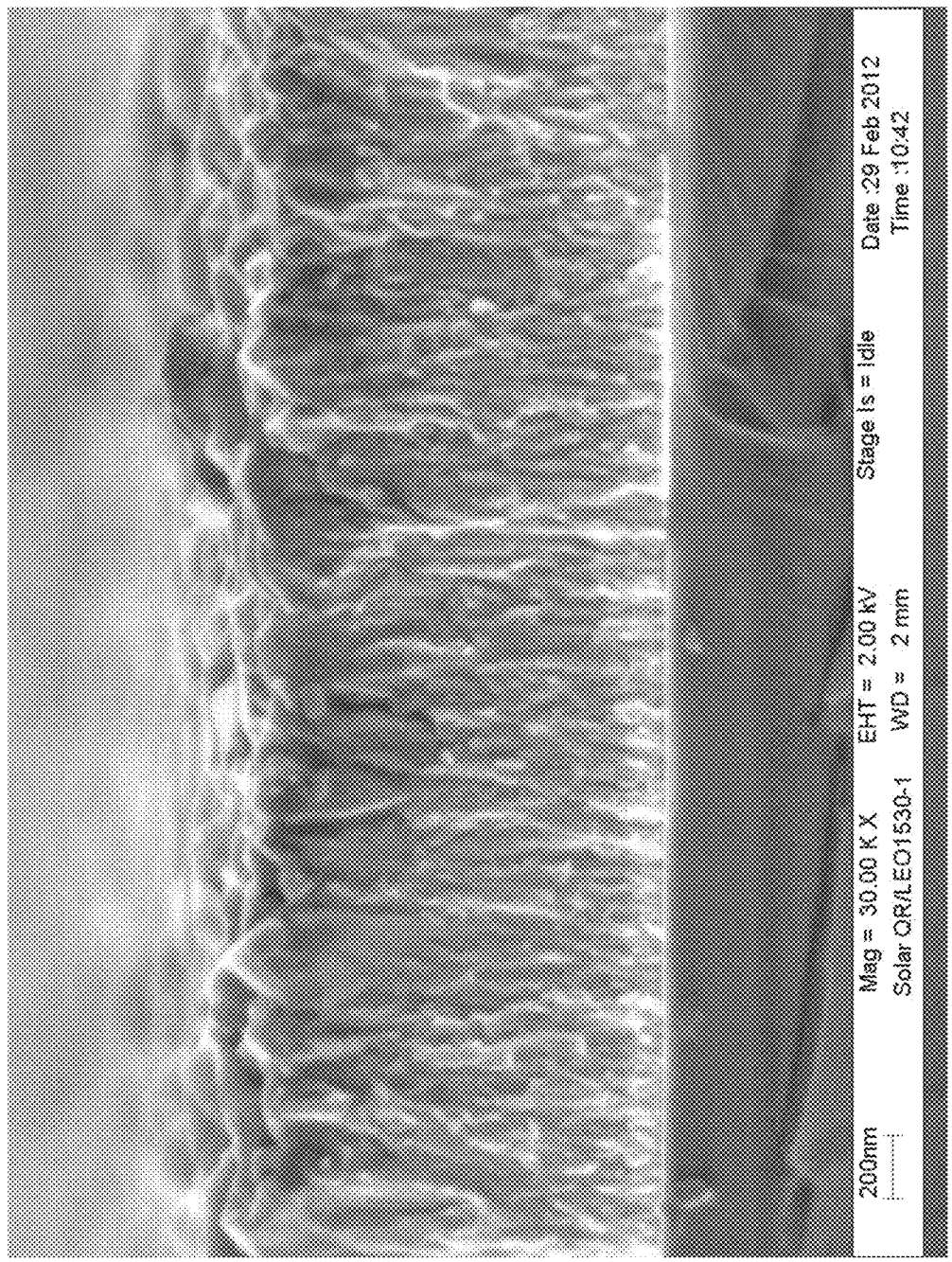
Figure 12C:
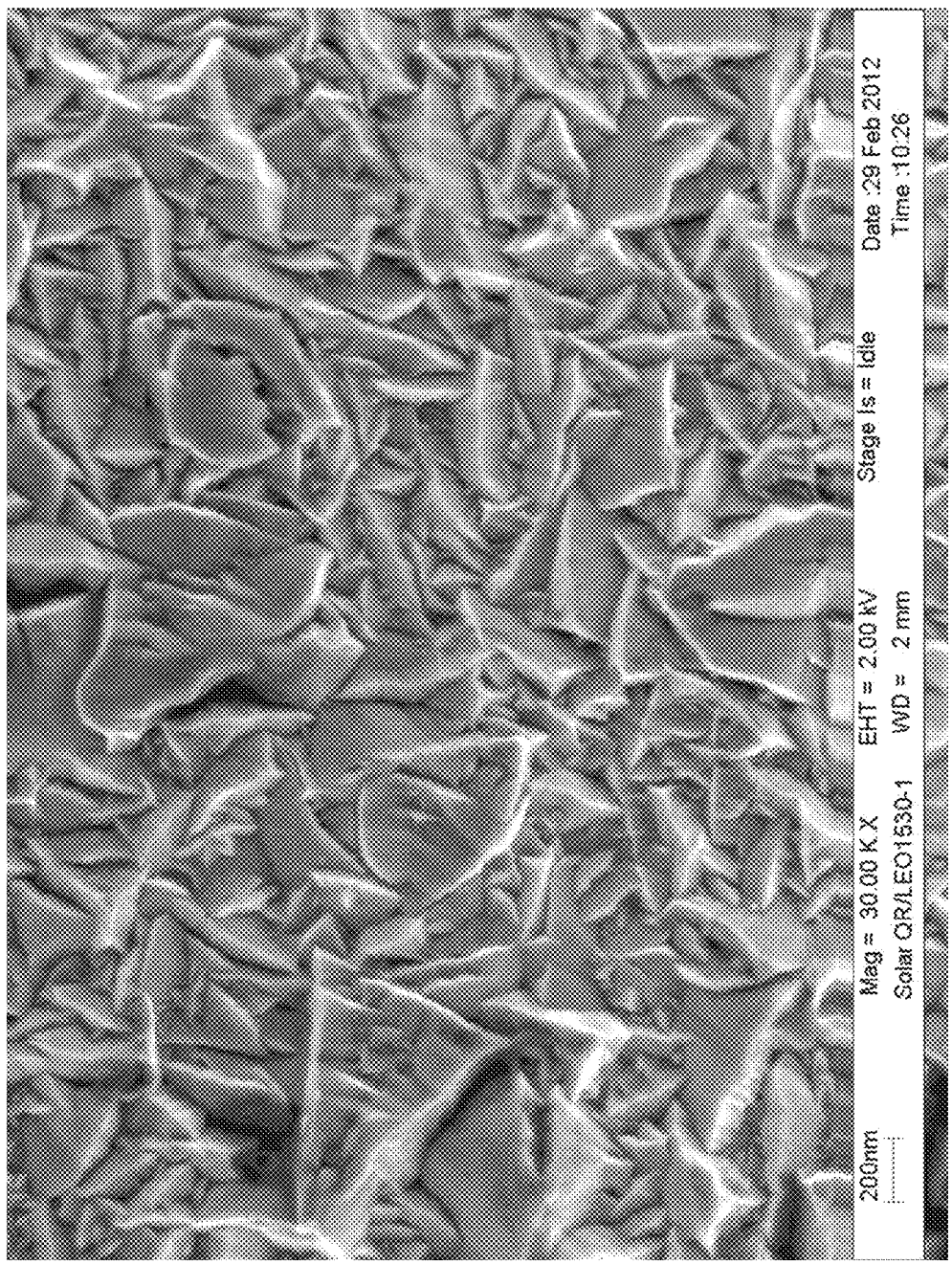
FIGS. 12C and 12D are plan and cross-sectional views of the seed layer microstructure of the solar panel of FIG. 1 or FIG. 7, in accordance with some embodiments.
Figure 12D:
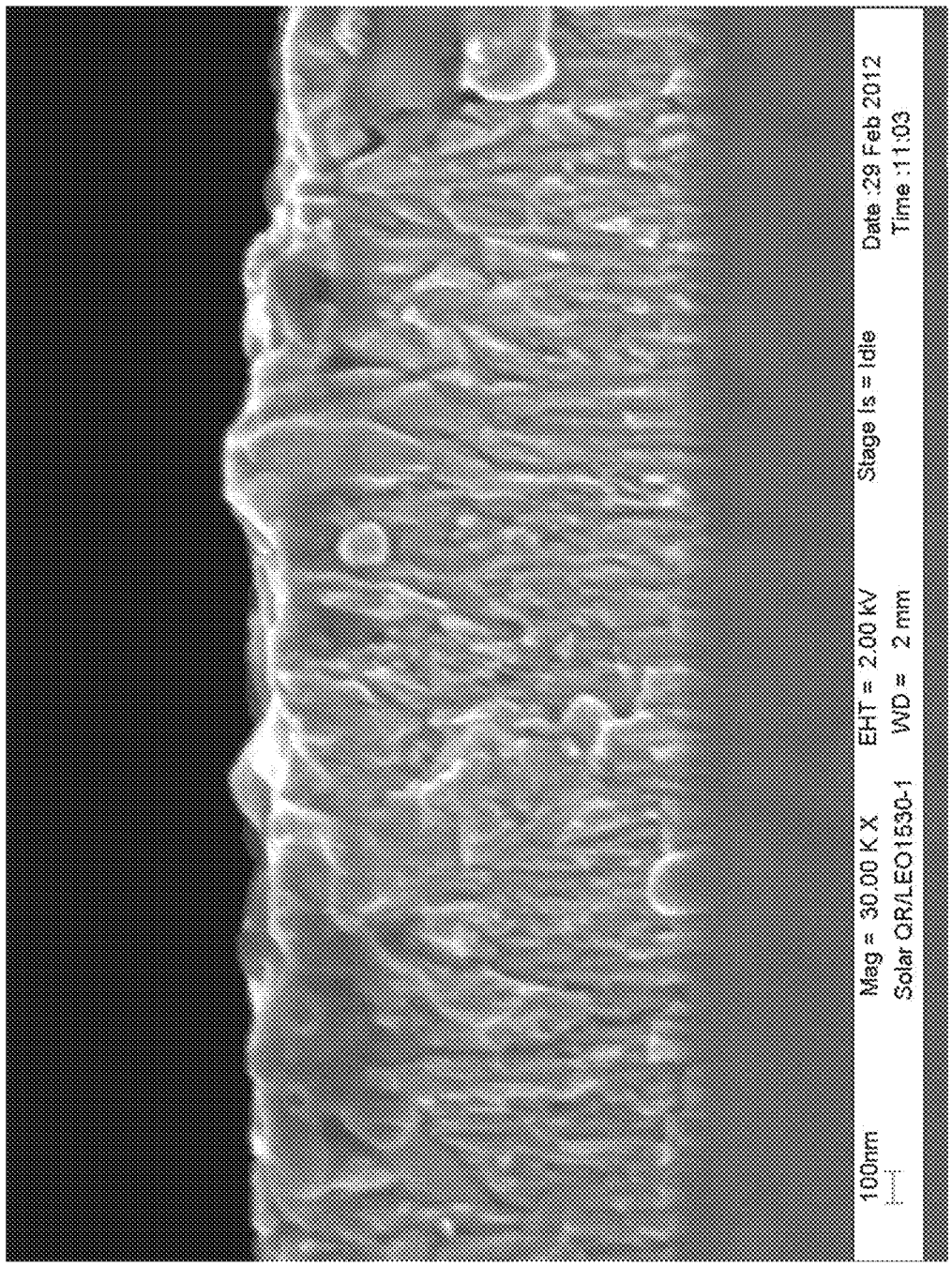
Figure 13:
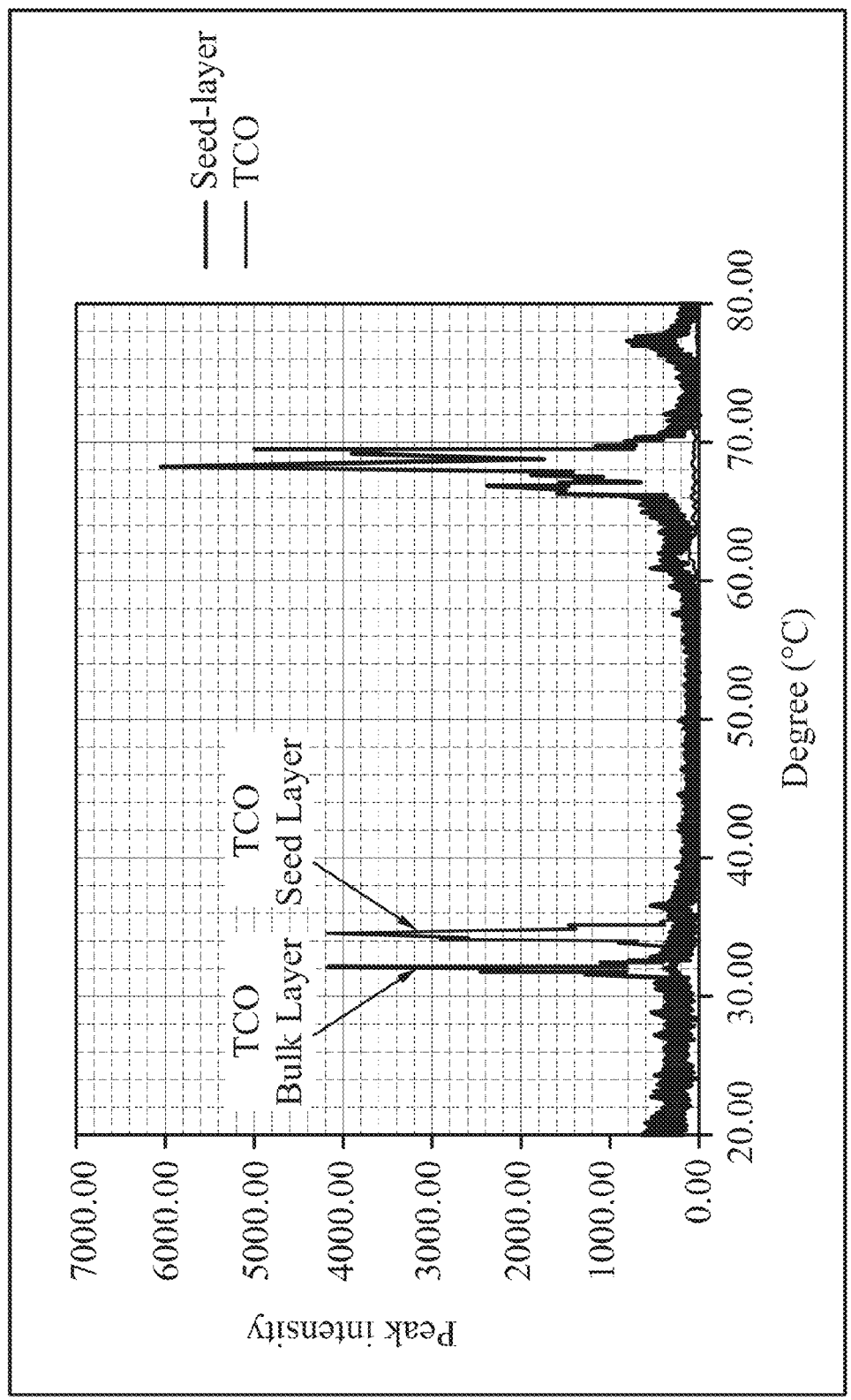
FIG. 13 is a diagram of X-ray diffraction (XRD) analysis for the seed layer material and bulk TCO material shown in FIGS. 12A-12D.

FIGS. 12A and 12B are scanning electron microscope (SEM) images showing the microstructure of seed layer 152, and FIGS. 12C and 12D are SEM images showing the microstructure of the higher temperature formed bulk TCO layer 151. Compared to the TCO bulk layer 151 (FIGS. 12C, 12D) formed at higher deposition temperatures, the smaller grain size of the seed layer 152 (FIGS. 12A, 12B) polycrystalline structure associated with improving the adhesive property of the TCO top electrode layer 150 is evident. FIG. 13 shows an X-ray diffraction (XRD) analysis of the TCO seed layer material and bulk top electrode material. FIG. 13 is a plot of reflected intensities versus the detector angle of the XRD analysis which shows that the TCO seed layer polycrystalline structure has crystals with a different orientation angle of about 34.4 degrees in contrast to the bulk TCO layer material with an angle of about 32 degrees, thereby further confirming the different crystalline orientation and grain structure of the seed layer material. The different structure of the TCO seed layer material and adhesion properties are achieved through the lower CVD deposition temperatures used according to the present disclosure.

Some embodiments described herein form a TCO seed layer and main TCO contact layer in the same process, without transferring the solar panel substrate between tools, and without breaking vacuum. Transport delays are eliminated and process time can be shortened. By providing a TCO seed layer at the edges, but not on the interior of the substrate, peeling is reduced or avoided, without degrading Rs.

In some embodiments, a solar panel comprises a back contact layer, an absorber layer over the back contact layer, a buffer layer over the absorber layer, and a front contact layer comprising a transparent conductive material over the buffer layer. The front contact layer has a plurality of outer edges and a seed layer comprising a seed layer material along the outer edges.

In some embodiments, a method of making a solar panel comprises: forming a back contact; forming an absorber layer over the back contact; forming a buffer layer over the absorber layer, and forming a front contact comprising a transparent conductive material over the buffer layer, the front contact having a plurality of outer edges and a seed layer comprising a seed layer material along the outer edges.

In some embodiments, an apparatus, comprises a chamber having one or more openings for supplying a process gas for forming a transparent conductive layer over a solar panel substrate having a center and a plurality of edges. A first heater plate is within the chamber. The first heater plate has a width that is smaller than a width of the solar panel substrate and adapted to underlie the center of the solar panel substrate. A second heater plate is adjacent the first heater plate, positioned to underlie the edges, such that the first heater plate and second heater plate together underlie the center and edges of the solar panel substrate. The apparatus is operable in a first mode for directly heating the center of the solar panel substrate but not the edges. The apparatus is operable in a second mode for directly heating the center and edges of the solar panel substrate.

The foregoing outlines features of several embodiments so that those skilled in the art can better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a solar panel, comprising:
   forming a back contact;
   forming an absorber layer over the back contact;
   forming a buffer layer over the absorber layer, and
   forming a front contact comprising a transparent conductive material over the buffer layer, the front contact having a plurality of outer edges and a seed layer comprising a seed layer material along the outer edges.

2. The method of claim 1, wherein the forming step includes applying the transparent conductive material and the seed layer material on the buffer layer simultaneously.

3. The method of claim 2, wherein the back contact is formed above a substrate, and the step of forming the front contact includes heating a center portion of the substrate without directly applying heat to the outer edges of the solar panel.

4. The method of claim 2, wherein the step of forming the front contact includes heating a center portion of the substrate to a range of about 150 degrees C. to about 200 degrees C., while the outer edges are in a temperature range from about 100 degrees C. to about 140 degrees C.

5. The method of claim 2, wherein the step of forming the front contact includes heating a center portion of the substrate using a heating plate that is smaller in a width dimension that the solar cell substrate.

6. The method of claim 5, wherein the back contact is formed above a substrate, and the step of forming the front contact further comprises:
   heating the center portion of the substrate and the edges of the substrate after using a heating plate that is smaller in a width dimension than the substrate.

7. The method of claim 1, wherein the back contact is formed above a substrate, and the step of forming the front contact comprises:
   raising a first heating plate that is smaller in a width dimension than the substrate, while the substrate is on the first heating plate;
   applying the transparent conductive material over the buffer layer while heating a center portion of the substrate;
   lowering the first heating plate until a top surface of the first heating plate is flush with a top surface of a second heating plate under the edge of the substrate; and
   applying additional transparent conductive material while heating the center of the substrate with the first heating plate and heating the edge of the substrate with the second heating plate simultaneously.

8. A method of making a solar panel, comprising:
   forming a back contact;
   forming an absorber layer over the back contact;
   forming a buffer layer over the absorber layer, the buffer layer having an interior region and a plurality of outer edges around the interior region; and
   forming a front contact comprising a transparent conductive material on an interior region of the buffer layer, and a seed layer comprising a seed layer material on the outer edges of the buffer layer.

9. The method of claim 8, wherein:
   the transparent conductive material and the seed layer material have the same chemical composition as each other; and
   the seed layer material has a smaller grain size than the transparent conductive material.

10. The method of claim 9, wherein the forming step includes applying the transparent conductive material and the seed layer material on the buffer layer simultaneously.

11. The method of claim 8, wherein the transparent conductive material has a first thickness, the seed layer has a second thickness, and a ratio of the first thickness to the second thickness is in a range from 2:1 to 30:1.

12. The method of claim 11, wherein the back contact is formed above a substrate, and the step of forming the front contact includes heating a center portion of the substrate without directly applying heat to the outer edges of the solar panel.

13. The method of claim 12, wherein the step of forming the front contact includes heating the center portion of the substrate to a range of about 150 degrees C. to about 200 degrees C., while the outer edges are in a temperature range from about 100 degrees C. to about 140 degrees C.

14. The method of claim 12, wherein the step of forming the front contact includes heating a center portion of the substrate using a heating plate that is smaller in a width dimension that the solar cell substrate.

15. The method of claim 8, wherein the seed layer material has a crystal orientation of about 34.4 degrees, and the transparent conductive material has a crystal orientation of about 32 degrees.

16. A method of making a solar panel, comprising:
forming a back contact;
forming an absorber layer over the back contact;
forming a buffer layer over the absorber layer, the buffer layer having an interior region and a plurality of outer edges around the interior region; and
simultaneously forming a transparent conductive material on an interior region of the buffer layer and a seed layer comprising a seed layer material on the outer edges of the buffer layer, the seed layer material having a same chemical composition as the transparent conductive material and a smaller grain size than the transparent conductive material.

17. The method of claim 16, wherein the back contact is formed above a substrate, and the step of forming the front contact includes heating a center portion of the substrate without directly applying heat to the outer edges of the solar panel.

18. The method of claim 17, wherein the step of simultaneously forming includes heating a center portion of the substrate using a heating plate that is smaller in a width dimension that the solar cell substrate.

19. The method of claim 18, wherein the back contact is formed above a substrate, and the step of simultaneously forming further comprises:
heating the center portion of the substrate and the edges of the substrate after using a heating plate that is smaller in a width dimension than the substrate.

20. The method of claim 16, wherein the back contact is formed above a substrate, and the step of simultaneously forming comprises:
raising a first heating plate that is smaller in a width dimension than the substrate, while the substrate is on the first heating plate;
applying the transparent conductive material over the buffer layer while heating a center portion of the substrate;
lowering the first heating plate until a top surface of the first heating plate is flush with a top surface of a second heating plate under the edge of the substrate; and
applying additional transparent conductive material while heating the center of the substrate with the first heating plate and heating the edge of the substrate with the second heating plate simultaneously.

* * * * *